US012625209B2

(12) United States Patent
Garwood et al.

(10) Patent No.: US 12,625,209 B2
(45) Date of Patent: May 12, 2026

(54) SYSTEMS AND METHODS FOR RADIO FREQUENCY (RF) BASED SPATIAL ENCODING IN MAGNETIC RESONANCE IMAGING USING FREQUENCY-MODULATED RF PULSES

(71) Applicant: Regents of the University of Minnesota, Minneapolis, MN (US)

(72) Inventors: Michael Garwood, Minneapolis, MN (US); Efraín Torres, Minneapolis, MN (US); Taylor Froelich, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 155 days.

(21) Appl. No.: 18/558,062

(22) PCT Filed: May 2, 2022

(86) PCT No.: PCT/US2022/027319
§ 371 (c)(1),
(2) Date: Oct. 30, 2023

(87) PCT Pub. No.: WO2022/232695
PCT Pub. Date: Nov. 3, 2022

(65) Prior Publication Data
US 2024/0219496 A1     Jul. 4, 2024

Related U.S. Application Data

(60) Provisional application No. 63/333,452, filed on Apr. 21, 2022, provisional application No. 63/182,355, filed on Apr. 30, 2021.

(51) Int. Cl.
*G01R 33/483* (2006.01)
*G01R 33/46* (2006.01)
*G01R 33/561* (2006.01)

(52) U.S. Cl.
CPC ..... *G01R 33/4831* (2013.01); *G01R 33/4616* (2013.01); *G01R 33/5617* (2013.01)

(58) Field of Classification Search
CPC ............ G01R 33/4831; G01R 33/3607; G01R 33/445; G01R 33/4616; G01R 33/5608; G01R 33/5617
See application file for complete search history.

(56) References Cited

U.S. PATENT DOCUMENTS 10,830,851 B2    11/2020   Wald et al.
2010/0237861 A1*  9/2010   Hennel ................ G01R 33/446
                                                324/307

(Continued)

OTHER PUBLICATIONS

PCT International Search Report and Written Opinion, PCT/US2022/027319, Aug. 16, 2022, 8 pages.

(Continued)

*Primary Examiner* — Rishi R Patel
(74) *Attorney, Agent, or Firm* — QUARLES & BRADY LLP

(57) ABSTRACT

Radio frequency ("RF") gradient based magnetic resonance imaging ("MRI") is provided by establishing a gradient in the RF transmit (B1) field using frequency-modulated RF pulses. A difference between the time-bandwidth product of the frequency-modulated RF pulses can be varied to provide impart different phases to magnetic resonance signals, where these different phases provide phase encoding of the acquired data. The time-bandwidth product difference can be created and varied by changing the pulse duration of one frequency-modulated RF pulse relative to the other while keeping the bandwidth of the pulses constant.

21 Claims, 10 Drawing Sheets

(56)            References Cited

U.S. PATENT DOCUMENTS

| | | | |
|---|---|---|---|
| 2015/0253403 A1 | 9/2015 | Grissom et al. | |
| 2016/0061917 A1 | 3/2016 | Chase et al. | |
| 2019/0369193 A1 | 12/2019 | Kobayashi et al. | |
| 2024/0219496 A1* | 7/2024 | Garwood | G01R 33/4831 |

OTHER PUBLICATIONS

Torres, et al., B1—gradient-based MRI using frequency-modulated Rabi-encoded echoes, Magnetic Resonance in Medicine, vol. 87, No. 2, Sep. 9, 2021, pp. 674-685, XP093238307, US ISSN: 0740-3194, DOI: 10.1002/mrm.29002; Retrieved from the Internet URL: https://onlinelibrary.wiley.com/doi/full-xml/10.1002/mrm.29002 [12 pgs].

Hasselwander, et al., Bloch-Siegert Phase-Encoded MRI with a Single RF Coil and Frequency-Swept Pulses, Proceedings of the International Society for Magnetic Resonance in Medicine, ISMRM, 25th Annual Meeting and Exhibition, Honolulu, HI, USA, Apr. 22-Apr. 27, 2017, No. 5047, Apr. 7, 2017, XP040692615 [3 pgs].

Froelich, et al., MRI exploiting frequency-modulated pulses and their nonlinear phase, Journal of Magnetic Resonance, vol. 318, Sep. 1, 2020, p. 106779, XP093238375, US ISSN: 1090-7807, DOI: 10.1016/j.jmr.2020.106779 [10 pgs].

Zhang, Phase-encoded xSPEN: A novel high-resolution volumetric alternative to Rare MRI, Magnetic Resonance in Medicine, vol. 80, No. 4, Mar. 1, 2018, pp. 1492-1506, XP055811273, US ISSN: 0740-3194, DOI: 10.1002/mrm.27143 [15 pgs].

European Patent Office, Extended European Search Report for corresponding European Patent Application No. 22796926.8, dated Jan. 23, 2025 [14 pgs].

Japanese Patent Office, First Office Action for corresponding JP Patent App. No. 2023-566,752, dated Nov. 18, 2025 [4 pgs].

Kartaeusch, et al., Spatial phase encoding using a Bloch-Siegert Shift gradient, Proceedings of International Society of Magnetic Resonance in Medicine, JPN6025046153, ISSN: 0005733294, 2013 [1 pg.].

* cited by examiner

402

Acquire magnetic resonance data using FREE technique to provide spatial encoding of magnetic resonance signals via R-value differences between frequency-modulated RF pulses

404

Reconstruct image(s) from the magnetic resonance data

SYSTEMS AND METHODS FOR RADIO FREQUENCY (RF) BASED SPATIAL ENCODING IN MAGNETIC RESONANCE IMAGING USING FREQUENCY-MODULATED RF PULSES

CROSS-REFERENCE TO RELATED APPLICATIONS

This application is a U.S. national phase application of pending International Application No. PCT/US2022/027319 filed on May 2, 2022 and now published as WO 2022/232695 A1, and entitled "SYSTEMS AND METHODS FOR RADIO FREQUENCY (RF) BASED SPATIAL ENCODING IN MAGNETIC RESONANCE IMAGING," which in turn claims the benefit of U.S. Provisional Patent Application Ser. No. 63/182,355, filed on Apr. 30, 2021, and entitled "SYSTEMS AND METHODS FOR RADIO FREQUENCY (RF) GRADIENT ENCODING IN MAGNETIC RESONANCE IMAGING USING FREQUENCY-MODULATED RF PULSES," and U.S. Provisional Patent Application Ser. No. 63/333,452, filed on Apr. 21, 2022, and entitled "SYSTEMS AND METHODS FOR RADIO FREQUENCY (RF) GRADIENT ENCODING IN MAGNETIC RESONANCE IMAGING USING FREQUENCY-MODULATED RF PULSES," all of which are herein incorporated by reference in their entirety.

STATEMENT REGARDING FEDERALLY SPONSORED RESEARCH

This invention was made with government support under EB025153 and EB027061 awarded by the National Institutes of Health. The government has certain rights in the invention.

BACKGROUND

Magnetic resonance imaging ("MRI") permits robust, high-resolution imaging with tunable image contrast that is free of ionizing radiation, thereby making it an indispensable tool in clinical medicine and biomedical research. However, the financial burden of purchasing and maintaining such a technology is a considerable draw back that limits MRI access to mostly wealthy institutions in developed countries. In recent years, researchers have focused on developing lower cost and/or portable MRI systems to address these challenges. Most of these investigations have focused on redesigning various components of the MRI system. Other approaches have targeted the stringent requirements of the static field $B_0$ gradient systems. Conventional linear $B_0$-gradient coils consume precious space in the magnet bore, require significant electrical power and water cooling to operate, require maintenance, and produce loud acoustic noise, which is a common complaint of patients and potentially damaging to their hearing. Elimination of the $B_0$-gradient system would significantly reduce the infrastructure needs and financial burden of MRI, while simultaneously permitting silent MRI.

SUMMARY OF THE DISCLOSURE

The present disclosure addresses the aforementioned draw backs by providing a method for magnetic resonance imaging, in which magnetic resonance data are acquired from a subject using an MRI system by generating a pulse sequence with the MRI system, where the pulse sequence includes: a radio frequency (RF) excitation pulse: a first frequency-modulated RF pulse having a first time-bandwidth product: and a second frequency-modulated RF pulse having a second time-bandwidth product. The first frequency-modulated RF pulse is generated after the RF excitation pulse, and the second frequency-modulated RF pulse is generated after the first frequency-modulated RF pulse. Magnetic resonance data are acquired with the MRI system by sampling magnetic resonance signals formed in response to the RF excitation pulse, where a phase whose value is dependent on the first time-bandwidth product and the second time-bandwidth product is imparted to magnetic resonance signals formed in response to the RF excitation pulse. The difference between the first time-bandwidth product and the second time-bandwidth product is changed in repetitions of the pulse sequence in order to phase encode the magnetic resonance data. An image is then reconstructed from the acquired magnetic resonance data.

It is another aspect of the present disclosure to provide a method for magnetic resonance imaging, in which magnetic resonance data are acquired from a subject using an MRI system to generate a pulse sequence that phase encodes the magnetic resonance data by imparting a phase to magnetic resonance signals by applying frequency-modulated RF pulses to the subject, where the frequency-modulated RF pulses have different time-bandwidth products, thereby defining an R-difference value between the frequency-modulated RF pulses, which causes the phase to be imparted to the magnetic resonance signals. An image is then reconstructed from the acquired magnetic resonance data.

It is still another aspect of the present disclosure to provide a method for magnetic resonance imaging, in which magnetic resonance data are acquired from a subject using an MRI system to generate a pulse sequence that generates a radio frequency (RF) gradient using frequency-modulated RF pulses, wherein the RF gradient provides spatial encoding of the magnetic resonance data. An image is then reconstructed from the acquired magnetic resonance data.

It is another aspect of the present disclosure that images can be reconstructed from data acquired using the acquisition techniques described in the present disclosure using a model-based image reconstruction framework.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

FIG. 1A shows an example multi-shot pulse sequence.

and shot number. The calculation is based on the propagator describing two AFPs in a double spin echo sequence. The duration $T_p$ of one AFP was held constant throughout shots (at a $T_p=10$ ms), while the other was incremented by $\Delta T_p=0.15$ ms in consecutive shots, beginning at $T_p=9.4$ ms. BW of both pulses was 5 kHz. Across shots, phase accumulated linearly, while across increasing $$\omega_1^{max}$$

the rate of change increased linearly as well.

Figures 4, 5:
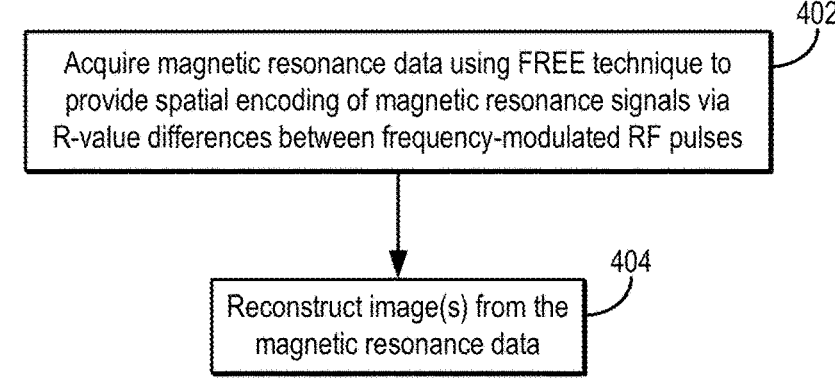

FIG. 4 is a flowchart setting forth the steps of an example method for magnetic resonance imaging using a frequency-modulated Rabi encoded echoes ("FREE") technique as described in some embodiments of the present disclosure.

FIG. 5 shows an example multi-shot double spin-echo pulse sequence that implements a FREE technique as described in some embodiments of the present disclosure.

Figures 6A, 6B, 6C:
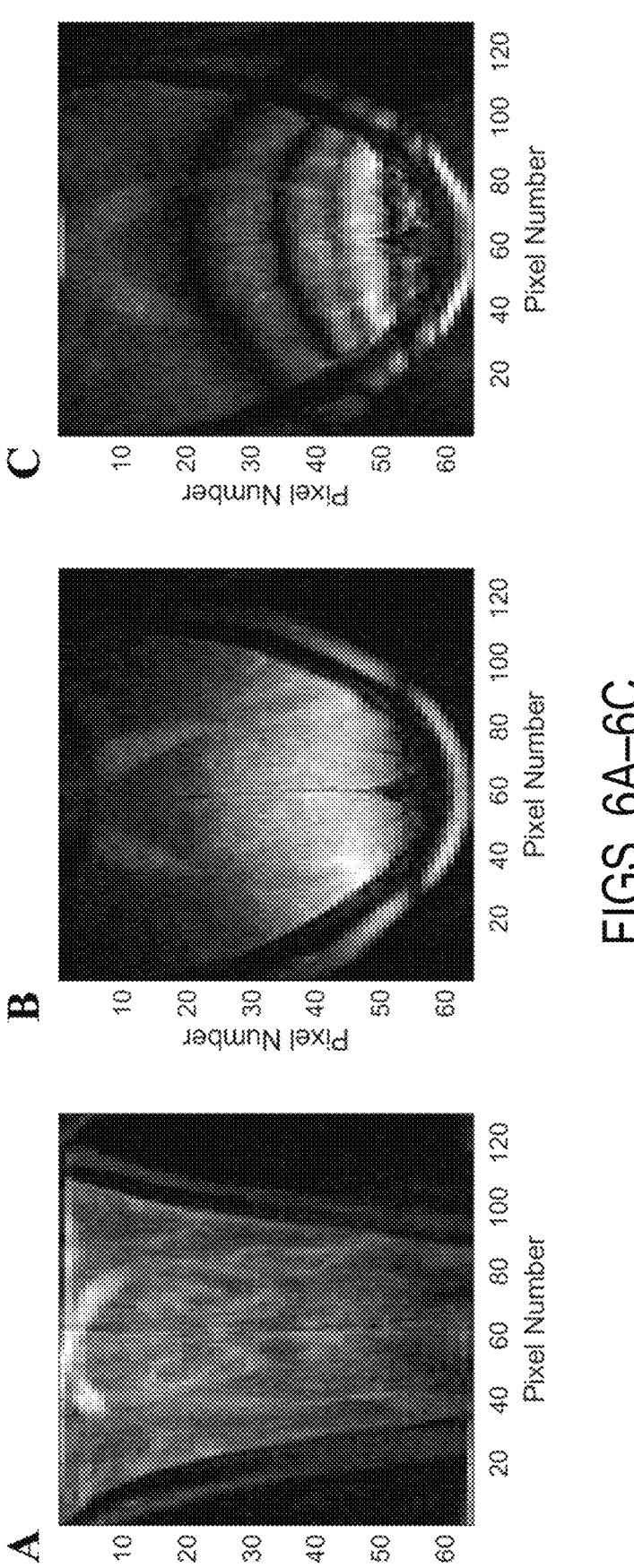

FIGS. 6A-6C depict example images acquired using a FREE-based pulse sequence (FIG. 6A) and pulse sequences with conventional phase encoding (FIGS. 6B and 6C).

Figure 7:
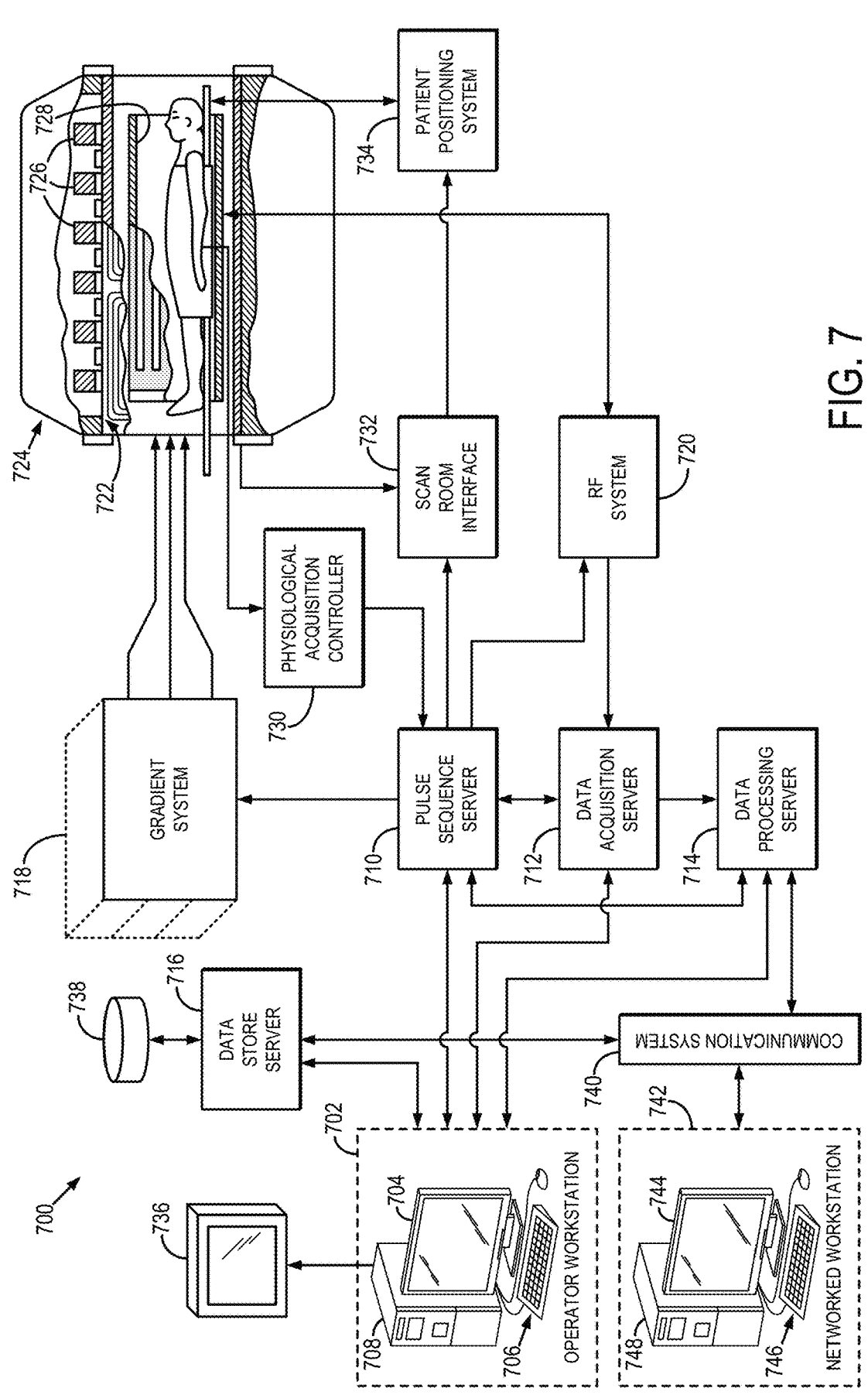

FIG. 7 is a block diagram of an example magnetic resonance imaging ("MRI") system, which may be implemented for some embodiments of the present disclosure.

Figure 8:
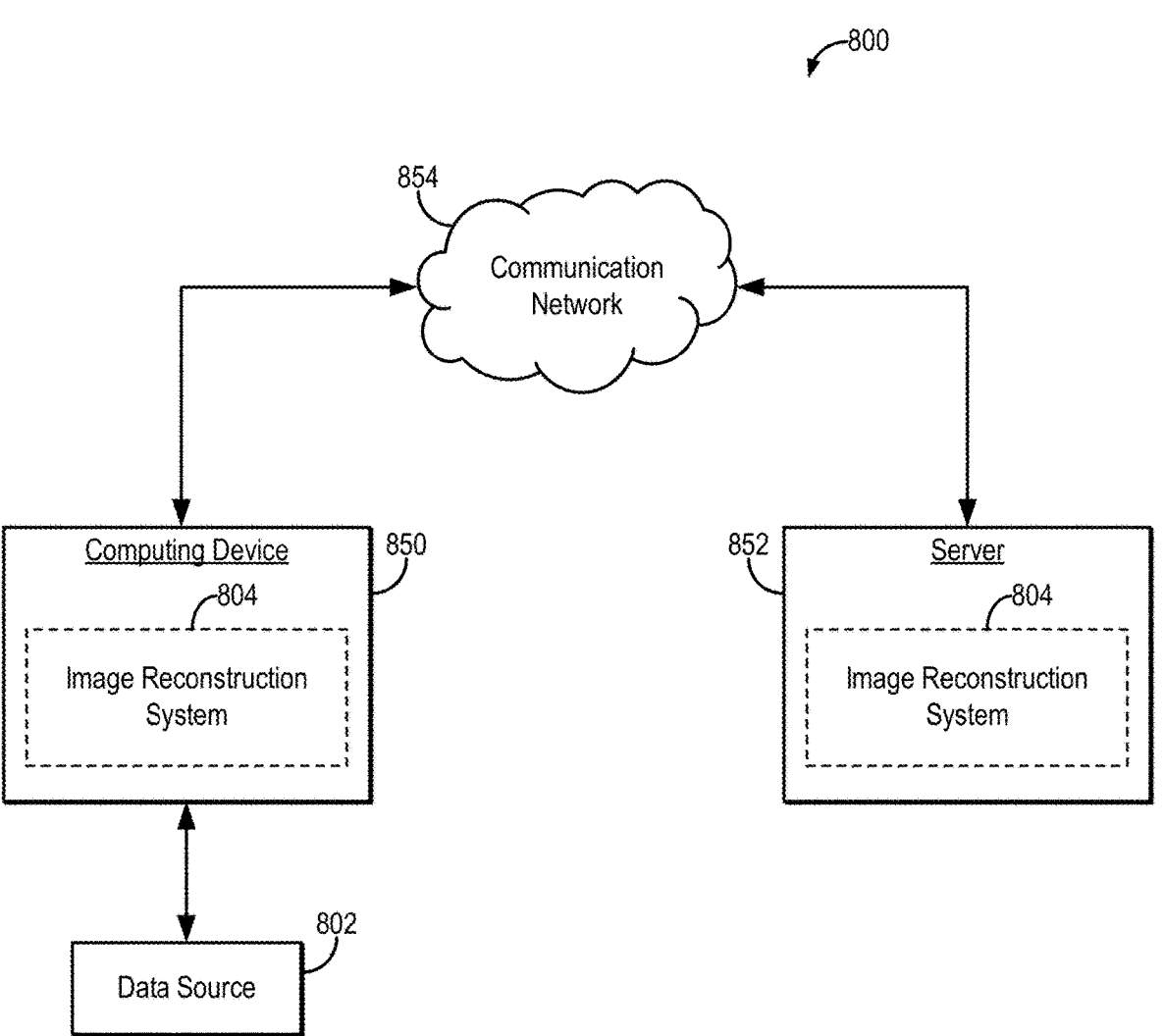

FIG. 8 is a block diagram of an example model-based image reconstruction system that can implement the methods described in some embodiments of the present disclosure.

Figure 9:
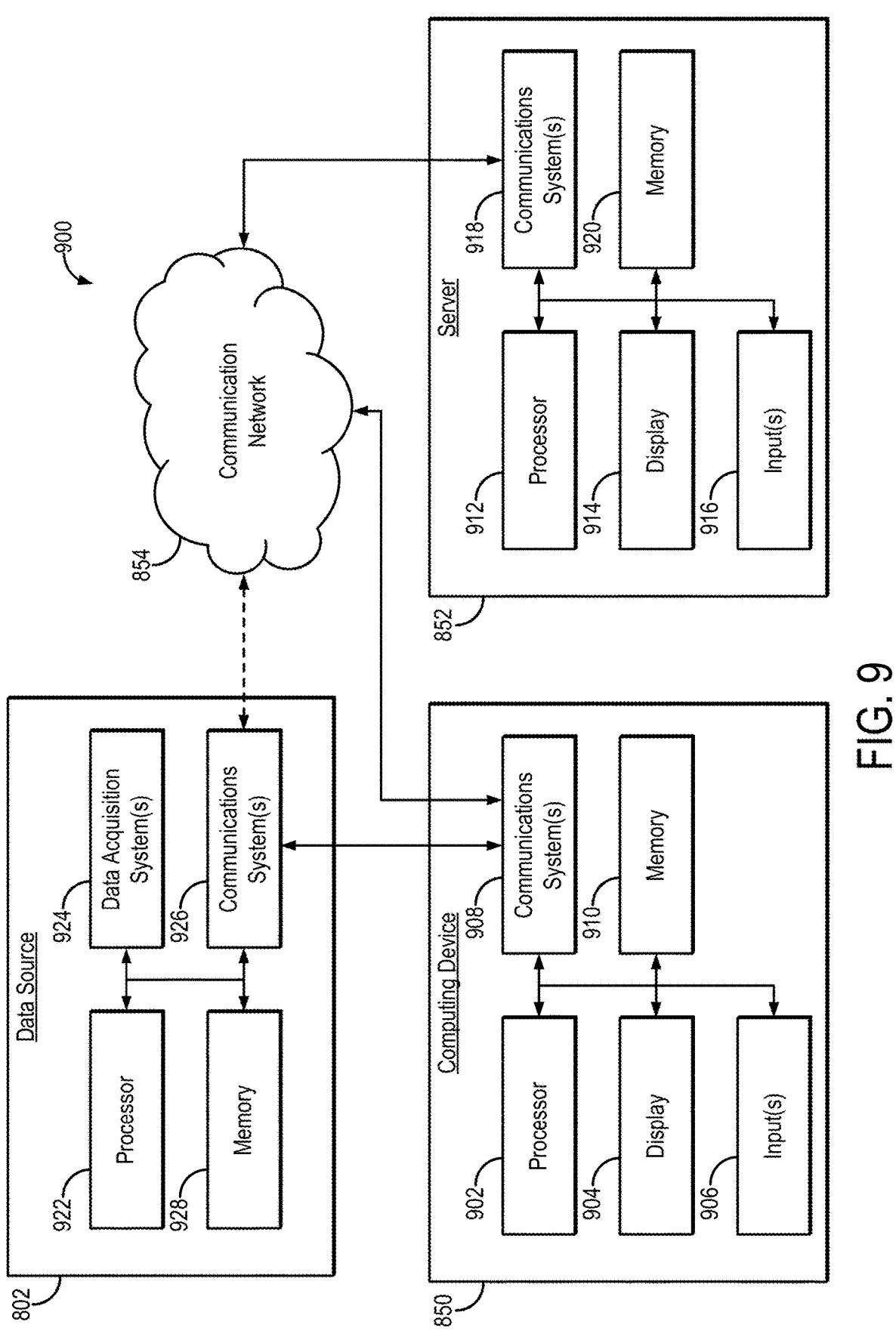

FIG. 9 is a block diagram of example components that can implement the system of FIG. 8.

DETAILED DESCRIPTION

Described here and in the attached appendices are systems and methods for radio frequency ("RF") gradient based magnetic resonance imaging ("MRI"). In particular, a gradient is established in the B1 RF field to enable B1-encoded pulses sequences, such as B1-encoded spin-echo pulse sequences. As a non-limiting example, the B1-field gradient can be established using a frequency-modulated Rabi encoded echoes ("FREE") technique. In some embodiments, a model-based image reconstruction framework can be implemented to reconstruct images from data acquired or otherwise encoded using the FREE techniques described in the present disclosure.

Advantageously, the systems and methods described in the present disclosure address the problems of the high-cost and low-accessibility of conventional MRI. In general, the systems and methods described in the present disclosure allow for spatial encoding, such as phase-encoding, based on B1-field gradients rather than using gradient coils to established a magnetic field gradient in the main magnetic field, $B_0$, of the MRI scanner. Advantageously, the FREE technique described in the present disclosure can be adapted for used with any suitable pulse sequence, including those based on spin echoes, gradient echoes, or other such principles.

Phase-encoding is used for spatial encoding in nearly all MRI techniques. The systems and methods described in the present disclosure allow for phase-encoding using only RF-coils, unlike current methods for conventional and portable MRI, which rely on hardware-specific gradient coil. Advantageously, the FREE technique described in the present disclosure allows for the removal of gradient coils, which opens the possibility of spatially encoding magnetic resonance data without gradient coils. Removing the need for gradient coils can significantly reduce cost in development and up-keeping of MRI systems.

With the FREE techniques described in the present disclosure, MRI systems can be more widely distributed. Advantageously, the systems and methods can be implemented with low-field (e.g., 0.2 T to 1.5 T) MRI systems, and/or portable MRI systems. In addition, the FREE techniques described in the present disclosure can facilitate silent MRI, since the FREE techniques allow for imaging without gradient coils, which are the components that create significant noise in conventional MRI. Noiseless MRI is advantageous for pediatric imaging and the general population.

As noted above, the systems and methods described in the present disclosure allow for spatially encoding magnetic resonance signals using a spatially dependent RF field, which allows for the complete removal of one or more of the $B_0$-gradient coils conventionally used in MRI. Previous RF imaging ("RFI") techniques have attempted a similar goal but have had limited success due to various reasons. In particular, rotating frame zeugmatography and other early RFI approaches are limited by their sensitivity to resonance offset, $\Delta\omega=\omega-\omega_{RF}$, where $\omega_0$ is the Larmor frequency and $\omega_{RF}$ is the B1 carrier frequency. With these methods, spatial information is encoded by evolving spins about an effective field, $B_{eff}$, $$B_{eff} = B_1\hat{x} + (\Delta\omega/\gamma)\hat{z};\qquad(1)$$

in the rotating frame (x', y', z'), where $\gamma$ is the gyromagnetic ratio. Transmit Array Spatial Encoding ("TRASE"), a more recent approach faces a similar issue and requires specialized coils with complex pulsing patterns. Another approach, Bloch-Siegert shift encoding, has demonstrated promising results, but it requires pulses with high power to add phase shifts from off-resonant pulses, while still being susceptible to resonance-offset effects.

The FREE systems and methods described in the present disclosure overcome the challenges of these previous RFI techniques by using a frequency-modulated ("FM") RFI method that accomplishes spatial encoding using adiabatic full-passage ("AFP") pulses (e.g., hyperbolic secant ("HS") pulses, chirp pulses), in spin-echo or other pulse sequences. As an example, 180-degree frequency swept RF pulses can be used, which advantageously don't require extra power (i.e., decreased power deposition) and are more efficient. In FREE, spatial information is encoded in the phase of the magnetization that results when AFPs are transmitted with a spatially varying RF field amplitude, $B_1(r)$.

When using an AFP as the refocusing pulse in a spin-echo sequence, the magnetization is left with a phase that depends on the $B_1(r,t)$ function used. This B1-dependent phase factor is additive to the $\Delta\omega$-dependent quadratic phase that results from the time dependence of the FM sweep. The B1 dependence of the resulting magnetization phase is utilized to accomplish B1-dependent phase encoding.

As a non-limiting example, the application of two AFP pulses with identical time-bandwidth product, R, in a double spin-echo sequence leads to refocused magnetization, removing all B0- and B1-dependent phase factors. With AFP pulses, the bandwidth can be held fixed when increasing the pulse duration by scaling the phase modulation proportionately. A relevant variable for controlling this process is the time-bandwidth product, R, which is the unitless product of the AFP pulse length $T_p$ and its bandwidth, BW. Application of two AFPs with differing time-bandwidth product leads to residual B1-dependent phase, with some dependence on $\Delta\omega$. For instance, the R-value (i.e., time-bandwidth product) of the generated pulse patterns can be increased by increasing the pulse duration, while holding the pulse's bandwidth constant. In FREE, this B1-dependent phase is exploited, in conjunction with a B1-coil map, to perform phase encoding with AFPs in a double spin-echo sequence.

When executed adiabatically, AFPs perform a slow sweeping of $\vec{B}_{eff}(t)$ such that the magnetization vector remains approximately collinear with $\vec{B}_{eff}(t)$, provided the spin has a Larmor frequency somewhere in the range of the frequency sweep. AFP pulses can be described in terms of their amplitude- and frequency-modulated functions, $\omega_1 = \gamma B_1(t)$ and $\omega_{RF}(t)$, both in units of rad/s. Of note, $\omega_1$ can be referred to as the Rabi frequency.

Hyperbolic secant (e.g., "HSn") pulses are one example class of AFP pulses, and are capable of delivering uniform inversion profiles across large bandwidths. For an HS1 pulse, the AM and FM functions can be written as $$\omega_1(\tau) = \omega_1^{max} \text{sech}(\beta\tau); \tag{2}$$

$$\omega_{RF}(\tau) = \omega_c + A \tanh(\beta\tau); \tag{3}$$

where $\tau = 2t/T_p - 1$ for $0 \leq t \leq T_p$, $\omega_1^{max}$ is the peak Rabi frequency that varies spatially in FREE, $\omega$ is the center frequency in the FM sweep, A is the frequency-sweep cutoff (e.g., 0.5 BW), and $\beta$ is a unitless truncation factor. As a non-limiting example, $\beta$ can be set such that $\text{sech}^{-1}(\beta) = 0.01$, so the pulse terminates when the amplitude reaches 1% of its peak value. In some implementations, frequency modulation can be implemented through a phase-modulated ("PM") function, which is related to the FM function by $$\phi(\tau) = \int_0^{\tau} (\omega_{RF}(t') - \omega_c) dt'. \tag{4}$$

When starting with transverse magnetization, the B1-dependent phase accrued from an HS1 pulse is given by, $$\phi_{HS} = \pm \frac{T_p}{2} \int_{-1}^{1} \sqrt{(\omega_1^{max})^2 \text{sech}^2(\beta\tau) + (\Omega - A \tanh(\beta\tau))^2} \, d\tau; \tag{5}$$

-continued $$\phi_{HS} = \pm \frac{T_p}{2} \int_{-1}^{1} \omega_{eff}(\tau, r) d\tau. \tag{6}$$

The variable $\Omega$ is used to represent any constant offset that occurs, for example, from chemical shift and/or B0 inhomogeneity. When decomposing the phase expressed by Eqn. (5) into $\Omega$- and $\omega_1^{max}$ components, the following is obtained, $$\phi_{HS1}(\Omega, \omega_1^{max}) = \phi_{HS1,1}(\Omega) + \phi_{HS1,2}(\omega_1^{max}); \tag{7}$$

where $$\phi_{HS1,1}(\Omega) = \frac{AT_p}{\beta} \ln\left(\frac{1}{\sqrt{A^2 - \Omega^2}}\right) - \frac{T_p\Omega}{2\beta} \ln\left(\frac{A + \Omega}{A - \Omega}\right); \tag{8}$$

$$\phi_{HS1,2}(\omega_1^{max}) = \tag{9}$$

$$AT_p\left(\frac{1}{\beta}\log(\omega_1^{max}) - 1\right) + \frac{T_p\sqrt{(\omega_1^{max})^2 - A^2}}{2\beta} \tan^{-1}\left(\frac{2A\sqrt{(\omega_1^{max})^2 - A^2}}{-2A^2 + (\omega_1^{max})^2}\right).$$

By utilizing the $\omega_1^{max}$ dependence in Eqns. (5) and (9), an RF coil producing an approximately linear B1 field can encode an approximately linear phase across the object, so long as the magnetization is inverted in an adiabatic manner. Within the approximation that the $\omega_1^{max}$ dependence of the magnetization phase (Eqn. (9)) is linear, a spin-echo FREE method is similar to conventional phase encoding in MRI. With both methods, fully sampled Fourier encoding requires the magnetization phase to vary linearly, such that the Nyquist criterion can be satisfied.

Figure 1A:
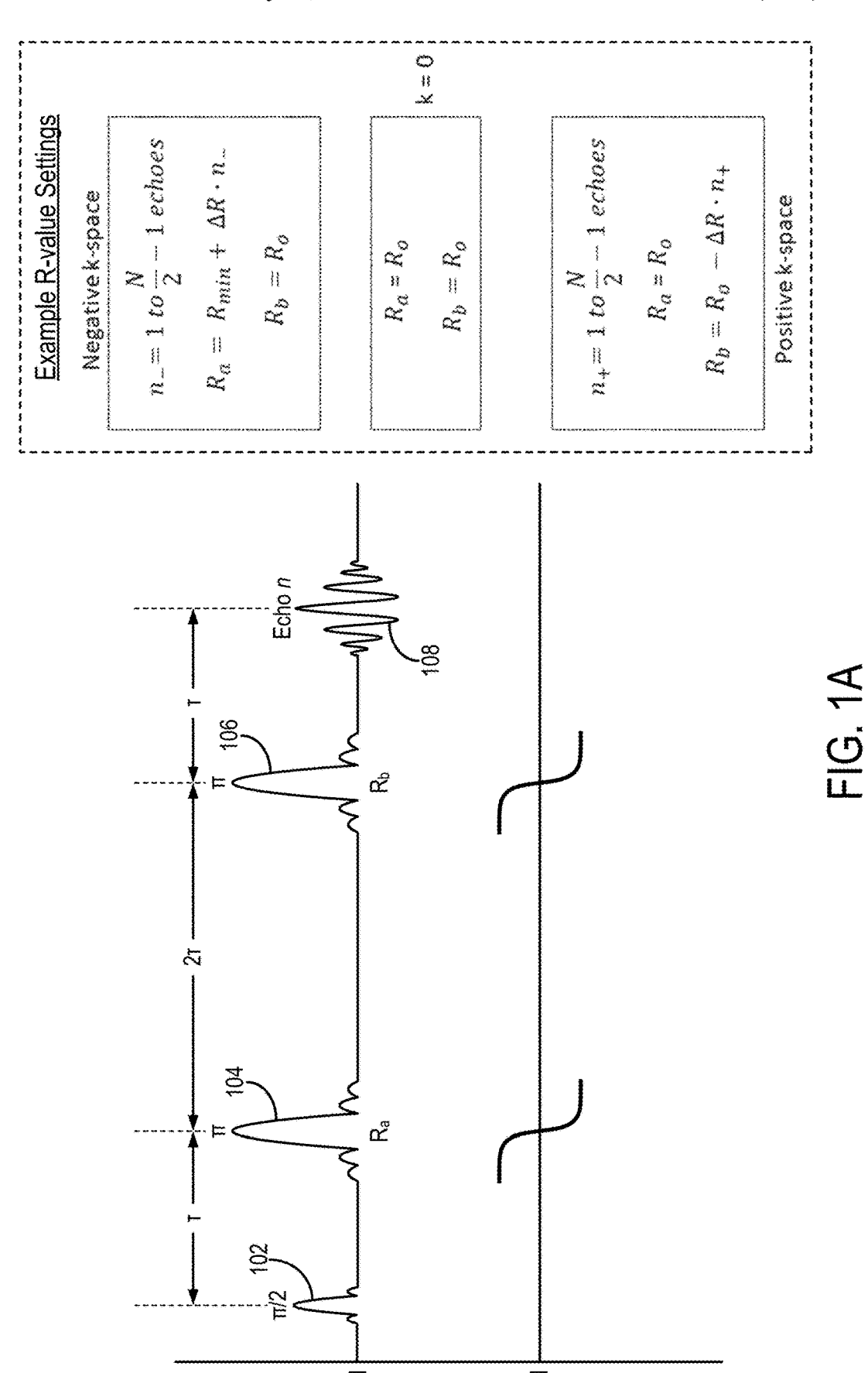
FIGS. 1A-IC show example pulse sequences that provide spatial encoding of magnetic resonance signals by generating a radio frequency ("RF") gradient using frequency-modulated RF pulses.

Although the FREE techniques described in the present disclosure can be utilized with any number of different pulse sequences, as one illustrative and non-limiting example, FREE can be implemented with a multi-shot double spin-echo sequence, as shown in FIG. 1A. This example pulse sequence includes two frequency-modulated RF pulses (e.g., HSn RF pulses), following excitation of transverse magnetization by an RF excitation pulse 102, such as a hard pulse. In this FREE double spin-echo sequence, the phase induced by a first frequency-modulated RF pulse 104 of a given R-value is linearly changed by a second frequency-modulated RF pulse 106 of the same or different R-value.

Imparting differences in R-values (ΔR) between the first and second frequency-modulated RF pulses (e.g., $R_a$ and $R_b$) 104, 106 enables phase to be encoded in the ensuing echo 108. Sampling the echo (e.g., magnetic resonance signals)

and utilizing the double spin-echo sequence in a multi-shot approach enables Cartesian phase-encoding.

When varying the R-value of AFP pulses in a double spin-echo sequence, or other suitable pulse sequence, the effect of $B_0$-inhomogeneity (accounted for by $\Omega$ in Eqn. (5)) is negated, while only a linear dependence on $$\omega_1^{max}$$

remains. The dependence of $\phi_{HS}$ on $$\omega_1^{max}$$

for double echoes produced with different R-values is described below with reference to a propagator analysis. A direct relationship exists between the difference in R-values (AR) and the amount of phase encoding achieved. For a given field-of-view ("FOV") and known B1 gradient, the value of the R-difference (i.e., AR) that satisfies the Nyquist criterion can be determined. A k-space trajectory can thus be achieved by repeated incrementation of AR.

Using multiple shots, k-space can be sampled by keeping the R-value of one of the pulses constant and varying the other by integer multiples of $\Delta R$. In some implementations, the first shot may have the greatest difference in R-values ($R_0$—$R_{min}$). Defining N as the number of samples to be collected, and $R_0$ as the R-value of the non-changing pulse, then, $$R_{min} = R_0 - \frac{N}{2}\Delta R. \tag{10}$$

Figure 1B:
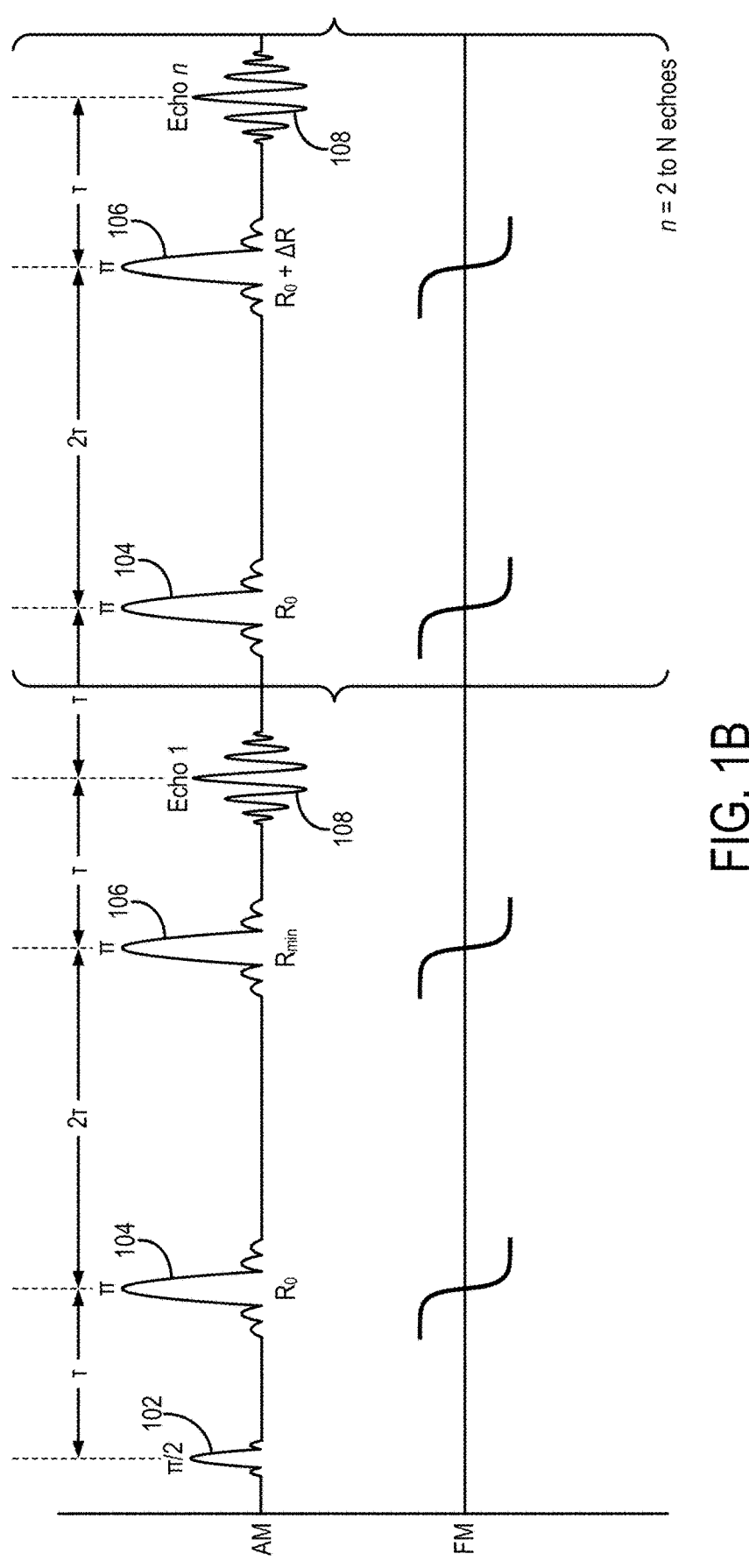
FIG. 1B shows an example single-shot pulse sequence.

FIG. 1B shows another example FREE pulse sequence, which implements a single-shot approach. In this example, the first double spin-echo pair has the greatest R-value difference. Subsequent refocusing (i.e., $\tau$) pulse pairs have a difference of exactly $\Delta R$ incrementally adding phase at each echo acquired.

Figure 1C:
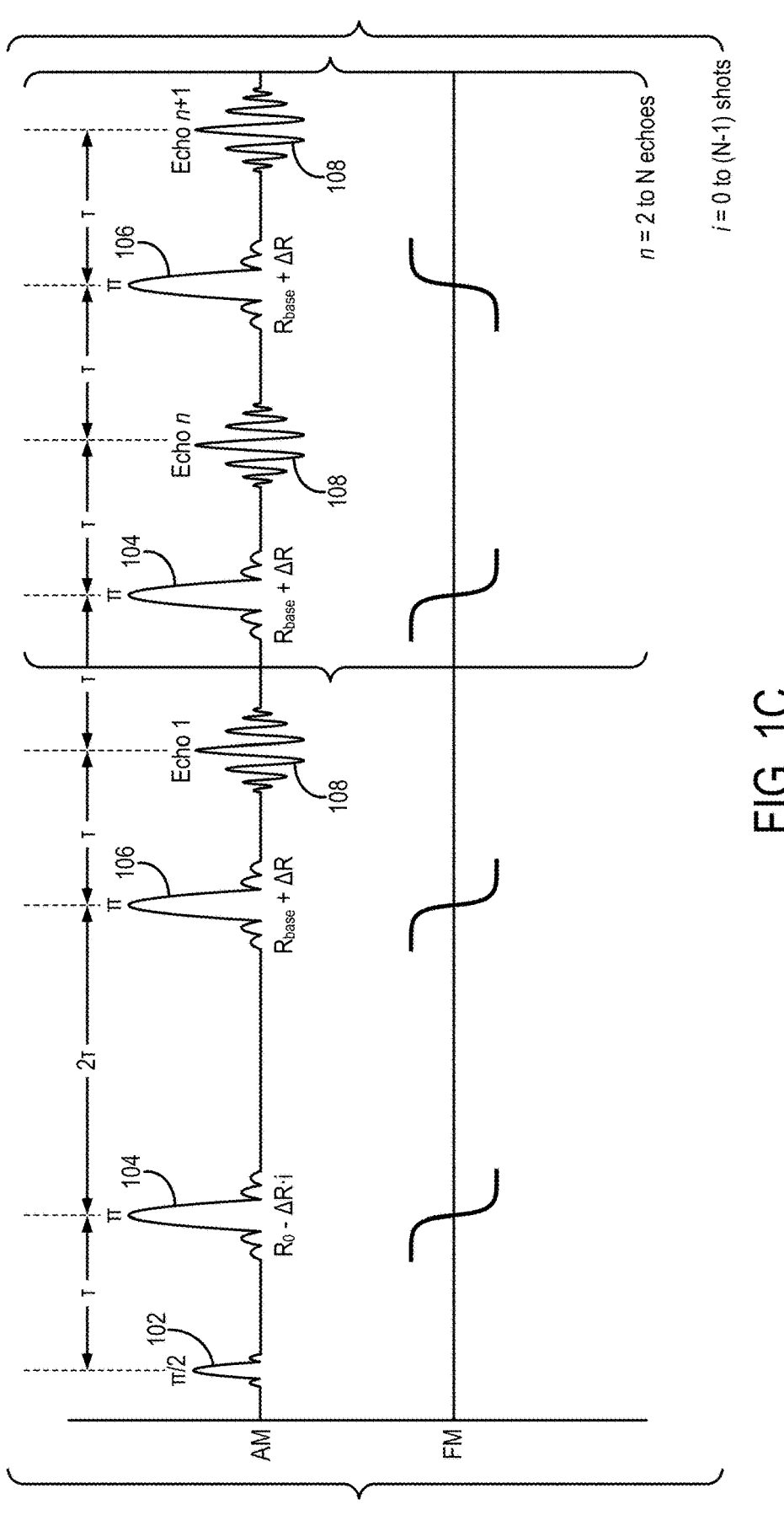
FIG. 1C shows another multi-shot pulse sequence.

FIG. 1C shows still another example FREE pulse sequence, which implements another multi-shot version in which all (odd and even) echoes are acquired. In this example, all pulses except for the first, have $R_{base}+\Delta R$, where $R_{base}$ is any adiabatic R-value. Further shots reduce the R-value of the first pulse ($R_0$) by integer values of $\Delta R$. The k-space matrix is created by concatenating the data columns (shot number) with rows as echo number.

Incrementing the R-value of one AFP by $\Delta R$ is equivalent to incrementing the magnetization phase due to its approximately linear dependence on $$\omega_1^{max}$$

and $\omega_{eff}$. It is also equivalent to incrementing $\Delta k$, similarly to conventional MRI. To further the analogy with conventional phase encoding, a relationship between $\Delta k$ and $\Delta R$ is developed here. For a pulse duration difference of $\Delta T_p$, differentiating $\omega_{eff}(t,r)$ with regards to space, and then integrating with respect to time yields, $$\Delta k = \frac{\Delta T_p}{2} \int_{-1}^{1} \frac{d}{dx}(\omega_1^{max}\text{sech}(\beta\tau)\hat{x} + A\tanh(\beta\tau)\hat{z})d\tau. \tag{11}$$

Here the variables of interest are $\Delta R = \Delta T_p \cdot BW$ and the linear gradient defined by $G_{PE} = BW_{Rabi}/FOV$, where $BW_{Rabi}$ is the bandwidth of the B1 coil used for encoding over the FOV and $BW_{Rabi} = B1$ ($r_{min}$)–B1 (max). Accordingly, the expressions $\Delta k$ and $\Delta R$ are, $$\Delta k = \frac{\Delta Tp \cdot BW_{Rabi}}{2 \cdot FOV} \cdot \Gamma(\beta); \tag{12}$$

$$\Delta R = \frac{BW \cdot 2}{BW_{Rabi} \cdot \Gamma(\beta)}; \tag{13}$$

where $$\Gamma(\beta) = \frac{1}{\beta}(2\arctan(\sinh(\beta))); \tag{14}$$

Eqns. (12) and (13) set $\Delta k$ and $\Delta R$ step size to sample k-space appropriately according to the FOV that encompasses $BWR_{abi}$ in space. The FOV is set by the encoding field of the B1 map, and its gradient. The designation $R_a$ and $R_b$ are used for the first and second AFP pulses, respectively (FIG. 1). Sweeping $R_a$ from $R_{min}$ to $R_{max}$ and holding $R_b$ constant, where $$R_{min} = R_b - \frac{N}{2} \cdot \Delta R; \tag{15}$$

$$R_{max} = R_b + \frac{N}{2} \cdot \Delta R, \tag{16}$$

with N defined as the number of points to be sampled, allows the sampling of k-space from $-k_{max}$ to $+k_{max}$ with the appropriate $\Delta k$. In this example sequence, k-space is sampled through multiple shots, beginning with sampling $-k_{max}$ and incrementing by $\Delta k$, defined in Eqn. (13) and (14), until reaching $+k_{max}$. To change $\Delta k$, the $BW_{Rabi}$ of the B1 coil can be changed in accordance with Eqn. (12).

The multi-shot sequence was optimized to minimize the maximum $T_p$ used. Rather than hold the stationary pulse constant and increment the modulating pulse's R-value from $R_{min}$ to $R_{max}$ by $\Delta R$, the modulating pulse can be incremented by $\Delta R$ until $R_{min}$ is equal to $R_b$. The order of the pulses can then be changed, and the modulating pulse incremented from $R_b$ back to $R_{min}$. This change effectively makes the maximum $T_p = R_b/BW$ as opposed to $T_p = R_{max}/BW$.

When FREE utilizes the $$\omega_1^{max}$$

dependent phase obtained with an HS1 pulse (Eqn. (9)), for all transverse magnetization components, a constant phase is added with each $\Delta T_p$, as given by Eqn. (8). This constant phase can be compensated for in image reconstruction to properly position the object in the image. An analysis of the following two equations, describing the off-resonance components of an HS1 pulse allows for this additional phase modulation that arises to be defined, $$\phi_1 = \frac{AT_p}{2\beta}\ln(A\cdot\text{sech}(\beta));\tag{17}$$

$$\phi_2(\Omega) = \frac{AT_{p,1}}{2\beta}\ln\left(\frac{1}{\sqrt{A^2-\Omega^2}}\right) - \frac{T_{p,1}\Omega}{2\beta}\ln\left(\frac{A+\Omega}{A-\Omega}\right).\tag{18}$$

Using the case where $\Omega=0$ and summing these independent phase components (Eqn. (17) and (18)), the net offset phase is defined as, $$\phi_{Rabi} = \frac{AT_{p,1}}{2\beta}\ln(\text{sech}\,(\beta)).\tag{19}$$

To describe two AFPs in the sequence, Eqn. (19) can be expanded to include the difference in the length of the pulses in the FREE sequence:

$$\Delta\phi_{Rabi} = 4\left(\frac{A}{2\beta}\ln(\text{sech}\,(\beta))\right)(T_{p,1}-T_{p,2});\tag{20}$$

$$\Delta\omega_{Rabi} = 2\left(\frac{A}{\beta}\ln(\text{sech}\,(\beta))\right).\tag{21}$$

Eqn. (21) describes the carrier frequency, which can be demodulated.

By assuming the adiabatic condition is fully satisfied and that the net rotation of $B_{eff}$ approaches $\pi$, an analytical expression for the double spin-echo FREE sequence can be obtained using a propagator analysis.

$$U = \exp(i\phi_0 I_z)\exp(i\Delta\alpha I_y)\exp(-i\phi_0 I_z)\exp(i\psi I_z),\tag{22}$$

where $\psi$ is the total angle of evolution about $B_{eff}$ defined by $$\psi(T_p) = \int_0^{T_p}\omega_{eff}(t)dt,\tag{23}$$

$\Delta\alpha$ is the net $B_{eff}$ sweep angle, and $\phi_0$ is the initial phase of the pulse. Assuming the adiabatic condition is satisfied, the transformations applied to the components of the magnetization vector can be described analytically, $$UI_xU^{-1} = I_x(\cos(\psi-\phi_0)\cos\Delta\alpha\cos\phi_0 - \sin(\psi-\phi_0)\sin\phi_0) +\tag{24}$$

$$I_y(\sin(\psi-\phi_0)\cos\phi + \cos(\psi-\phi_0)\cos\Delta\alpha\sin\phi_0) + I_z(\cos(\psi-\phi_0)\sin\Delta\alpha);$$

$$UI_yU^{-1} = I_x(-\sin(\psi-\phi_0)\cos\Delta\alpha\cos\phi_0 - \cos(\psi-\phi_0)\sin\phi_0) +\tag{25}$$

$$I_y(\cos(\psi-\phi_0)\cos\phi_0 + \sin(\psi-\phi_0)\cos\Delta\alpha\sin\phi_0) + I_z(\sin(\psi-\phi_0)\sin\Delta\alpha);$$

$$\left[UI_yU^{-1} = I_x(\cos\phi_0\sin\Delta\alpha) + I_y(\sin(\phi_0)\sin\Delta\alpha) + I_z(\cos\Delta\alpha).\tag{26}\right.$$

Using this general propagator, an inversion ($\Delta\alpha=x$) of $B_{eff}$ can be expressed in rotation matrix form as, $$U_\pi = \begin{bmatrix} -\cos(2\phi_0-\psi) & -\sin(2\phi_0-\psi) & 0 \\ -\sin(2\phi_0-\psi) & \cos(2\phi_0-\psi) & 0 \\ 0 & 0 & -1 \end{bmatrix}.\tag{27}$$

In the FREE sequence shown in FIG. 1A, the BW is held constant as the pulse length $T_p$ of one of the two AFP pulses increases or decreases from one shot to the next. Having a difference in the time-bandwidth product ($\Delta R=\Delta T_p\cdot BW$) with each shot causes a proportional amount of increase in phase ($2\phi_0-\psi$) to be imprinted on the ensuing echo.

Figure 2A:
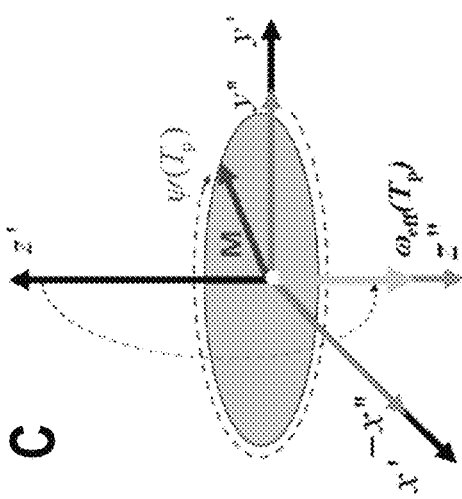
FIGS. 2A-2C depict the trajectory of an arbitrary magnetization vector (M) and its phase accumulation throughout an adiabatic full passage in a first (x',y',z') and second (x",y",z') rotating frame of reference.
Figure 2B:
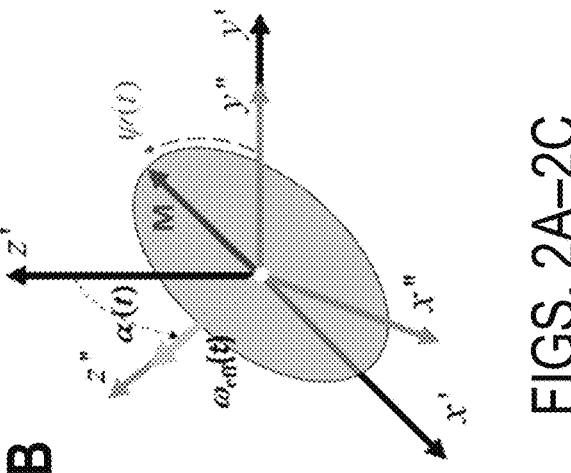
Figure 2C:
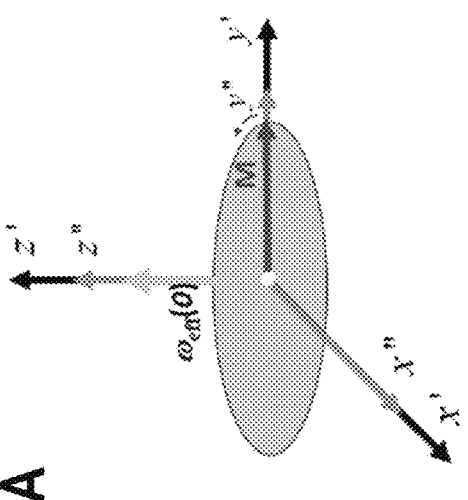

FIGS. 2A-2C depict the trajectory of a magnetization vector (M) and its phase accumulation throughout an AFP, in a first (x',y',z') and second (x'',y'',z') rotating frame of reference. At the beginning of the AFP pulse (FIG. 2A), M is in the transverse plane and all rotating frames are aligned. During the AFP (FIG. 2B), M evolves at the effective frequency ($\omega_{eff}$) as the effective field rotates by $\alpha(t)$, ending with flipped transverse magnetization (FIG. 2C). Phase $\psi(t)$ is accrued over the duration of the AFP. At the end of the pulse, the second rotating frame is inverted relative to the first frame, and the final phase accrued is $\psi(T_p)$.

Concatenating two AFP pulses with equal pulse parameters ($R_a=R_b$ for FIG. 1) leads to an identity transform, e.g., $$U_{\pi,1}U_{\pi,2} = \begin{bmatrix} 1 & 0 & 0 \\ 0 & 1 & 0 \\ 0 & 0 & 1 \end{bmatrix}.\tag{28}$$

A rotation matrix generated from the propagator analysis which allows evaluation of the case of two AFPs with different $T_p$ settings for the case of $\phi_0=0$ and identical BW, $$U_{\pi,1}U_{\pi,2} = \begin{bmatrix} \cos(\psi_2)\cos(\psi_1)+\sin(\psi_2)\sin(\psi_1) & -\cos(\psi_2)\sin(\psi_1)+\sin(\psi_2)\cos(\psi_1) & 0 \\ -\sin(\psi_2)\cos(\psi_1)+\cos(\psi_2)\sin(\psi_1) & \cos(\psi_2)\cos(\psi_1)+\sin(\psi_2)\sin(\psi_1) & 0 \\ 0 & 0 & 1 \end{bmatrix}.\tag{29}$$

Figure 3:
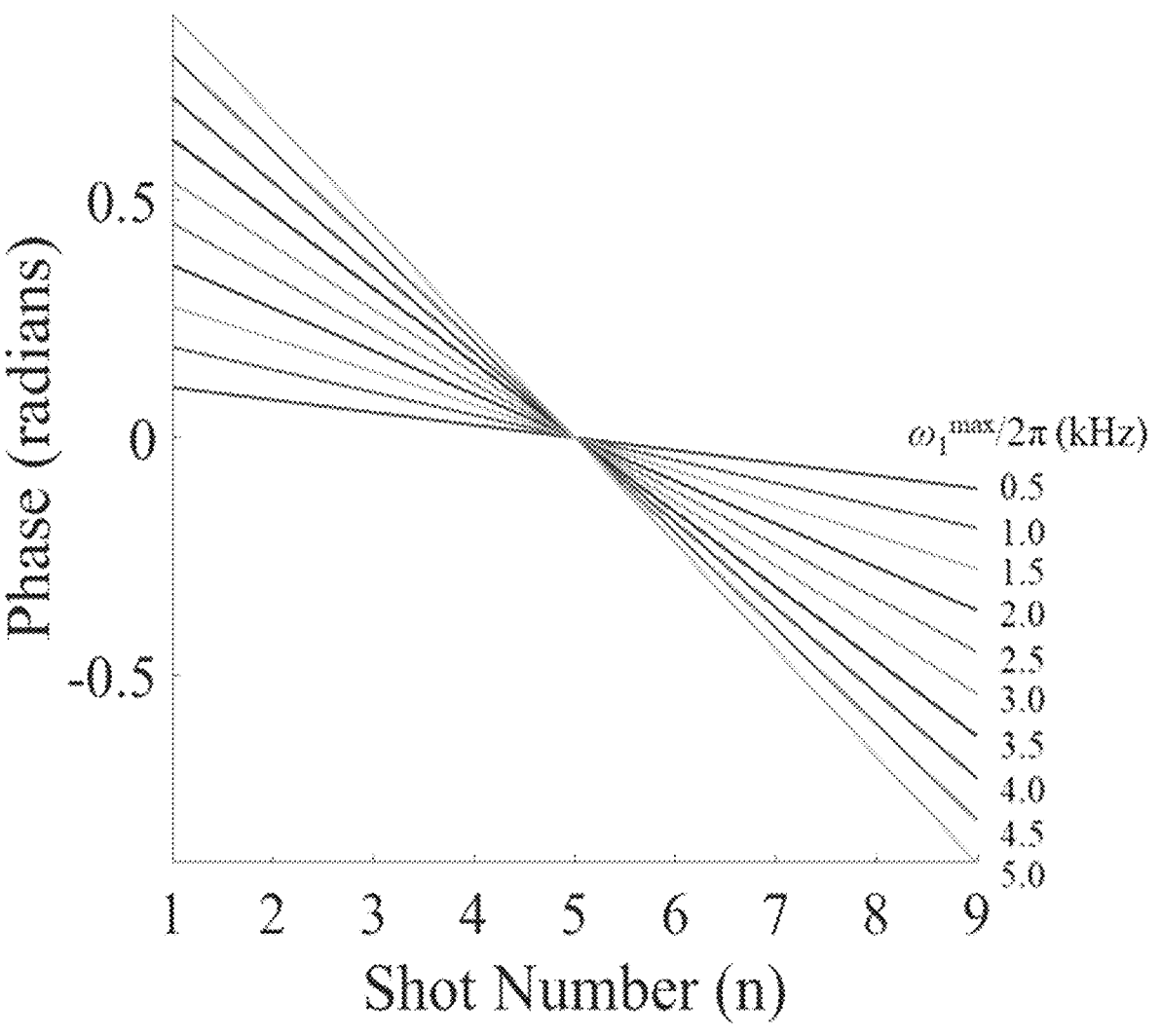
FIG. 3 shows propagator analysis calculations showing how the magnetization phase varies in the FREE as a function of RF amplitude $$(\omega_1^{max})$$

In the double spin-echo FREE sequence shown in FIG. 1A, the duration of the first AFP (which may be called the modulating pulse) changes incrementally from shot-to-shot, while all parameters of the second AFP (which may be called the stationary pulse) remain fixed. This propagator analysis of fully adiabatic passage pulses shows that phase encoding based on a $B_1(r)$ gradient is feasible (FIG. 3).

Here, a new imaging method, which promotes the complete removal of $B_0$ gradient coils in an MRI system, particularly targeting the phase-encoding gradients, has been described. The multi-shot double spin-echo FREE sequence, and other pulse sequences implementing the FREE technique, utilizes the adiabatic condition to be highly immune to nonuniformity of $B_0$. This resilience is present up to the bandwidth of the pulse. If greater resistance to inhomogeneity is needed, the pulse's BW can be increased, making FREE extremely robust to the expected $B_0$ inhomogeneity in lower-cost systems.

Previous RFI approaches fall short in the presence of large resonance offset. With conventional (constant frequency) pulses, resonance offset has the effect of tilting $B_{eff}$ out of the transverse plane and, as a result, the ability to effectively rotate magnetization diminishes as the pulse duration increases.

Experimentally, FREE was tested using a 1.5 T magnet with low $B_0$ homogeneity due to the fact that it was ramped-down from 4T and high-order shimming was not done. The non-linearities in the surface coil's B1 map dominated the distortions seen in FREE's reconstruction, stretching and compressing the reconstruction towards the nonlinear regions of the coil. The effects that FREE has on spins are equivalent to standard MRI phase encoding, so many of the approaches available to standard MRI for distortion-correction, parameter optimization, or post-processing can be reasonably applied here to tackle the fractional pixel distortion seen at lower $B_1$ values. One condition to improve reconstructions, as shown experimentally and in simulations, was to utilize FREE with higher $B_1$ values and linear coil maps. An unexpected benefit of FREE is that the field-of-view ("FOV") is defined from the beginning of the coil's field, as opposed to set by the gradients. In applications where the RF coil can be attached to the subject, FREE could lead to a higher resistance to motion artifacts, as the FOV moves with the coil.

In some of the examples described in the present disclosure, FREE was implemented by holding the BW of the pulses constant and increasing or decreasing the length of one of the pulses. By using a $B_1$ gradient and two AFPs with different pulse lengths, magnetization phase can then encode spatial information. Other RFIs do not utilize FM pulses, and with solely AM pulses, increasing or decreasing the length of the pulse changes the BW of the pulse. This has the effect of phase-encoding variable ranges of isochromats. When utilizing FREE, holding the BW constant enabled the phase-encoding of the same range of isochromats.

The systems and methods described in the present disclosure make use of FM functions and an approximately linearly varying B1 map. The FREE sequence and experimental results described in the present disclosure are non-limiting examples. FREE does not limit the FM function to HS1 pulses, as shown through the use of HS8 pulses in experiments. In addition, it is contemplated that FREE is compatible with other pulses not yet investigated that may carry their own benefits (e.g., chirp). The example sequence described above is a multi-shot approach, whereby one point of k-space is acquired per shot: however, more complex FREE sequences can be developed, such as ones that utilize spin-echo trains to acquire all of k-space in one shot or more complex k-space trajectories. When a pulse sequence implements spin-echo or other echo trains, the R-difference value can additionally or alternatively be changed within the pulse sequence.

Referring now to FIG. 4, a flowchart is illustrated as setting forth the steps of an example method for magnetic resonance imaging a subject using a FREE technique to acquire data from the subject. As described above in more detail, in a FREE technique data are acquired using gradients in the B1 RF field to provide spatial encoding (e.g., phase encoding) of magnetic resonance signals. In this way, the FREE technique allows for magnetic resonance data to be acquired from a subject without the need for magnetic field gradient coils.

The method includes acquiring magnetic resonance data from a subject using a FREE technique, as indicated at step 402. As described above, the magnetic resonance data can be generally acquired using a FREE technique, in which spatial encoding of magnetic resonance signals is provided, at least partially, by appropriately modulating the B1 RF field, as opposed to establishing magnetic field gradients (e.g., gradients in the main magnetic field) by use of magnetic field gradient coils.

In general, the magnetic resonance data can be acquired using a pulse sequence that includes two or more frequency-modulated RF pulses. By varying the time-bandwidth products of the frequency-modulated RF pulses in different repetitions of the pulse sequence (and/or different shots of a multi-shot pulse sequence), different phases are imparted to the magnetic resonance signals, thereby providing different spatial encoding of the magnetic resonance signals. For example, differences in the time-bandwidth products of two frequency-modulated RF pulses in one repetition and/or shot of a pulse sequence will impart one phase value, so by adjusting that difference between time-bandwidth products different phase values can be imparted in subsequent repetitions and/or shots.

For instance, magnetic resonance data can be acquired using a pulse sequence that generally includes an RF excitation pulse and at least a first and second frequency-modulated RF pulse. As a non-limiting example, a first frequency-modulated RF pulse can have a first time-bandwidth product and a second frequency-modulated RF pulse can have a second time-bandwidth product that is different from the first time-bandwidth product. The frequency-modulated RF pulses can include various different types of frequency-modulated RF pulses, such as adiabatic full-passage RF pulses, HSn RF pulses, chirp RF pulses, and so on.

A difference between the first time-bandwidth product and the second time-bandwidth product is selected or otherwise designed such that a phase is imparted to magnetic resonance signals formed in response to the RF excitation pulse. By changing this difference between the first time-bandwidth product and the second time-bandwidth product, different phase values are imparted to the magnetic resonance signals, thereby providing a mechanism for spatially encoding the magnetic resonance signals. In some embodiments, the difference between the first and second time-bandwidth products can be changed by adjusting a duration of one or more of the frequency-modulated RF pulses. For example, the pulse duration of one or more of the frequency-modulated RF pulses can be increased in subsequent repetition time ("TR") periods of the pulse sequence. In some instances, the bandwidth of the first frequency-modulated RF pulse and/or the second frequency-modulated RF pulse can be held constant while adjusting the RF pulse duration. In some repetitions of the pulse sequence, the first time-bandwidth product can be set equal to the second time-bandwidth product.

The magnetic resonance data are acquired by sampling the magnetic resonance signals formed in response to the RF excitation pulse and spatially encoded as a result of the time-bandwidth product difference between the frequency-modulated RF pulses.

After the magnetic resonance data are acquired, one or more images are reconstructed from the data, as indicated at step 404. In some embodiments, a Fourier transform-based image reconstruction can be used to reconstruct images from the magnetic resonance data, similar to conventional reconstruction techniques. In other embodiments, other reconstruction techniques can be used, including parallel image reconstruction techniques, iterative reconstruction techniques, machine learning-based imaged reconstruction techniques, and so on.

As one non-limiting example, a model-based image reconstruction technique can be used to reconstruct images acquired using a FREE technique. For instance, an iterative first-order proximal gradient method can be used to solve a regularized linear inverse problem that is based on a model of the FREE encoding technique. As an example, the following regularized linear inverse problem can be solved:

$$\|Ax - y\|_2^2 + \lambda\Omega(x); \qquad (30)$$

where A represents the encoding matrix, which can be determined via full Bloch simulation with known field inhomogeneities and receive coil sensitivities. For instance, as a non-limiting example, to generate the encoding matrix, the Bloch equations can be simulated using a 2D parallelized Bloch simulator. The simulation can be ran with a sub-voxel averaging factor (e.g., a sub-voxel averaging factor of 8) along both dimensions to mimic a continuous object. With the encoding matrix generated, the receive coil sensitivity profiles can be incorporated into the model by constructing a matrix out of the coil sensitivities as each coil sees the same encoding. This approach can be readily extended to multiple receive coils and used to reconstruct images from undersampled data, or other data acquired using accelerating data acquisition techniques. Advantageously, using a model-based image reconstruction allows for more variation in how FREE encoding can be implemented. For example, when using a model-based image reconstruction B1 coils with nonlinear gradients can be used, since the nonlinear B1 field's distortions can be appropriately corrected for using the model-based image reconstruction.

In an example study, data were acquired with a magnetic resonance spectrometer configured for two Tx/Rx channels and interfaced to a 1.5 T, 90-cm magnet with a clinical gradient system. The magnet was designed to operate at 4 T, but was ramped down to 1.5 T without re-shimming, leaving a relatively nonuniform $B_0$. A single-loop 10-cm coil was utilized for RF transmission and reception in all experiments. Based on images, a peak $$\omega_1^{max}/2\pi$$

value of 7.7 kHz was achievable near the center of the surface coil loop.

An optimized multi-shot FREE double spin-echo sequence was utilized with HS8 pulses, as shown in FIG. 5. For FREE imaging, the $G_y$ gradient was unused and phase encoding was done with the $B_1$ gradient. For the FREE sequence, the shortest repetition time attainable with the particular MRI scanner used in this example was TR=24 s. To minimize $T_1$ weighting, a TR=2.4 s was chosen for conventional (phase-encoded) MRI scan. An axial slice (10 mm thickness) was excited using a sinc pulse (5 lobes) of 3-ms duration. All pulses had a BW of 3.9 kHz. In FREE, R-values were incremented from an $R_{min}$=20 with a $\Delta R$=0.44 to an $R_{max}$=43.66. For all images, a FOV of 10 cm was utilized. For FREE, the FOV was set by appropriately selecting the $\Delta R$ value given the $BW_{rabi}$ of the $B_1$ coil being used (see Eqns. (12) and (13)). For standard MRI, the $\Delta k$ was set through the conventional $B_0$ gradient coils. The image matrix sizes were 64 (phase-encode) by 128 (readout).

FIGS. 6A-6C show example images obtained in this example study. FREE and conventional MRI phase encoding was compared through imaging the back of a participant's head. FIG. 6A shows an image obtained using FREE phase encoding performed in the y-direction. Non-linearities were present both at low B1 values and non-linear regions of the coil map. An optimized FREE double spin echo train multi-shot sequence was utilized for phase encoding and reconstruction was done through the Fourier Transform. FIG. 6B shows an image obtained using standard MRI phase encoding using a double spin echo sequence. FIG. 6C shows an image obtained similar to FIG. 6B, except that the RF power used for the sinc excitation pulse was increased to that used for the HS8 pulses, to allow an rough estimate of the spatial variation of RF amplitude, $$\omega_1^{max}.$$

Referring particularly now to FIG. 7, an example of a magnetic resonance imaging ("MRI") system 700 that can implement the methods described here is illustrated. The MRI system 700 includes an operator workstation 702 that may include a display 704, one or more input devices 706 (e.g., a keyboard, a mouse), and a processor 708. The processor 708 may include a commercially available programmable machine running a commercially available operating system. The operator workstation 702 provides an operator interface that facilitates entering scan parameters into the MRI system 700. The operator workstation 702 may be coupled to different servers, including, for example, a pulse sequence server 710, a data acquisition server 712, a data processing server 714, and a data store server 716. The operator workstation 702 and the servers 710, 712, 714, and 716 may be connected via a communication system 740, which may include wired or wireless network connections.

The pulse sequence server 710 functions in response to instructions provided by the operator workstation 702 to operate a radiofrequency ("RF") system 720, and optionally a gradient system 718. In some configurations, the MRI system 700 may not include a gradient system 718 and instead spatial encoding can be provided by using the FREE techniques described in the present disclosure to generate B1 gradients with the RF system 720. When the gradient system 718 is present and implemented for partial spatial encoding (e.g., slice encoding), gradient waveforms for performing a prescribed scan are produced and applied to the gradient system 718, which then excites gradient coils in an assembly 722 to produce the magnetic field gradients that are used for spatially encoding magnetic resonance signals along spatial dimensions otherwise not encoded using the FREE techniques described in the present disclosure. In these configurations, the gradient coil assembly 722 can form part of a magnet assembly 724 that includes a polarizing magnet 726 and a whole-body RF coil 728.

RF waveforms are applied by the RF system 720 to the RF coil 728, or a separate local coil to perform the prescribed magnetic resonance pulse sequence. Responsive magnetic resonance signals detected by the RF coil 728, or a separate local coil, are received by the RF system 720. The responsive magnetic resonance signals may be amplified, demodulated, filtered, and digitized under direction of commands produced by the pulse sequence server 710. The RF system 720 includes an RF transmitter for producing a wide variety of RF pulses used in MRI pulse sequences. The RF transmitter is responsive to the prescribed scan and direction from the pulse sequence server 710 to produce RF pulses of the desired frequency, phase, and pulse amplitude waveform. The generated RF pulses may be applied to the whole-body RF coil 728 or to one or more local coils or coil arrays.

The RF system 720 also includes one or more RF receiver channels. An RF receiver channel includes an RF preamplifier that amplifies the magnetic resonance signal received by the coil 728 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M = \sqrt{I^2 + Q^2}\,; \tag{31}$$

and the phase of the received magnetic resonance signal may also be determined according to the following relationship:

$$\varphi = \tan^{-1}\left(\frac{Q}{I}\right). \tag{32}$$

The pulse sequence server 710 may receive patient data from a physiological acquisition controller 730. By way of example, the physiological acquisition controller 730 may receive signals from a number of different sensors connected to the patient, including electrocardiograph ("ECG") signals from electrodes, or respiratory signals from a respiratory bellows or other respiratory monitoring devices. These signals may be used by the pulse sequence server 710 to synchronize, or "gate," the performance of the scan with the subject's heart beat or respiration.

The pulse sequence server 710 may also connect to a scan room interface circuit 732 that receives signals from various sensors associated with the condition of the patient and the magnet system. Through the scan room interface circuit 732, a patient positioning system 734 can receive commands to move the patient to desired positions during the scan.

The digitized magnetic resonance signal samples produced by the RF system 720) are received by the data acquisition server 712. The data acquisition server 712 operates in response to instructions downloaded from the operator workstation 702 to receive the real-time magnetic resonance data and provide buffer storage, so that data is not lost by data overrun. In some scans, the data acquisition server 712 passes the acquired magnetic resonance data to the data processor server 714. In scans that require information derived from acquired magnetic resonance data to control the further performance of the scan, the data acquisition server 712 may be programmed to produce such information and convey it to the pulse sequence server 710.

The data processing server 714 receives magnetic resonance data from the data acquisition server 712 and processes the magnetic resonance data in accordance with instructions provided by the operator workstation 702. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 714 are conveyed back to the operator workstation 702 for storage. Real-time images may be stored in a data base memory cache, from which they may be output to operator display 702 or a display 736. Batch mode images or selected real time images may be stored in a host database on disc storage 738. When such images have been reconstructed and transferred to storage, the data processing server 714 may notify the data store server 716 on the operator workstation 702. The operator workstation 702 may be used by an operator to archive the images, produce films, or send the images via a network to other facilities.

The MRI system 700 may also include one or more networked workstations 742. For example, a networked workstation 742 may include a display 744, one or more input devices 746 (e.g., a keyboard, a mouse), and a processor 748. The networked workstation 742 may be located within the same facility as the operator workstation 702, or in a different facility, such as a different healthcare institution or clinic.

The networked workstation 742 may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may be exchanged between the data processing server 714 or the data store server 716 and the networked workstations 742, such that the data or images may be remotely processed by a networked workstation 742.

Referring now to FIG. 8, an example of a system 800 for reconstructing images from data acquired using a FREE technique using an image reconstruction, which in some instances may be a model-based image reconstruction framework, in accordance with some embodiments of the systems and methods described in the present disclosure is shown. As shown in FIG. 8, a computing device 850 can receive one or more types of data (e.g., k-space data, receiver coil sensitivity data) from data source 802. In some embodiments, computing device 850 can execute at least a portion of an image reconstruction system 804 to reconstruct images from magnetic resonance data (e.g., k-space data) acquired using a FREE technique. In some embodiments, the image reconstruction system 804 can implement a model-based image reconstruction, as described above.

Additionally or alternatively, in some embodiments, the computing device 850 can communicate information about data received from the data source 802 to a server 852 over a communication network 854, which can execute at least a portion of the image reconstruction system 804. In such embodiments, the server 852 can return information to the computing device 850 (and/or any other suitable computing device) indicative of an output of the image reconstruction system 804.

In some embodiments, computing device 850 and/or server 852 can be any suitable computing device or combination of devices, such as a desktop computer, a laptop computer, a smartphone, a tablet computer, a wearable computer, a server computer, a virtual machine being executed by a physical computing device, and so on. The computing device 850) and/or server 852 can also reconstruct images from the data.

In some embodiments, data source 802 can be any suitable source of data (e.g., measurement data, images reconstructed from measurement data, processed image data), such as an MRI system, another computing device (e.g., a server storing measurement data, images reconstructed from measurement data, processed image data), and so on. In some embodiments, data source 802 can be local to computing device 850. For example, data source 802 can be incorporated with computing device 850 (e.g., computing device 850 can be configured as part of a device for measuring, recording, estimating, acquiring, or otherwise collecting or storing data). As another example, data source 802 can be connected to computing device 850 by a cable, a direct wireless link, and so on. Additionally or alternatively, in some embodiments, data source 802 can be located locally and/or remotely from computing device 850, and can communicate data to computing device 850) (and/or server 852) via a communication network (e.g., communication network 854).

In some embodiments, communication network 854 can be any suitable communication network or combination of communication networks. For example, communication network 854 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), other types of wireless network, a wired network, and so on. In some embodiments, communication network 854 can be a local area network, a wide area network, a public network (e.g., the Internet), a private or semi-private network (e.g., a corporate or university intranet), any other suitable type of network, or any suitable combination of networks. Communications links shown in FIG. 8 can each be any suitable communications link or combination of communications links, such as wired links, fiber optic links, Wi-Fi links, Bluetooth links, cellular links, and so on.

Referring now to FIG. 9, an example of hardware 900 that can be used to implement data source 802, computing device 850, and server 852 in accordance with some embodiments of the systems and methods described in the present disclosure is shown.

As shown in FIG. 9, in some embodiments, computing device 850 can include a processor 902, a display 904, one or more inputs 906, one or more communication systems 908, and/or memory 910. In some embodiments, processor 902 can be any suitable hardware processor or combination of processors, such as a central processing unit ("CPU"), a graphics processing unit ("GPU"), and so on. In some embodiments, display 904 can include any suitable display devices, such as a liquid crystal display ("LCD") screen, a light-emitting diode ("LED") display, an organic LED ("OLED") display, an electrophoretic display (e.g., an "e-ink" display), a computer monitor, a touchscreen, a television, and so on. In some embodiments, inputs 906 can include any suitable input devices and/or sensors that can be used to receive user input, such as a keyboard, a mouse, a touchscreen, a microphone, and so on.

In some embodiments, communications systems 908 can include any suitable hardware, firmware, and/or software for communicating information over communication network 854 and/or any other suitable communication networks. For example, communications systems 908 can include one or more transceivers, one or more communication chips and/or chip sets, and so on. In a more particular example, communications systems 908 can include hardware, firmware, and/or software that can be used to establish a Wi-Fi connection, a Bluetooth connection, a cellular connection, an Ethernet connection, and so on.

In some embodiments, memory 910 can include any suitable storage device or devices that can be used to store instructions, values, data, or the like, that can be used, for example, by processor 902 to present content using display 904, to communicate with server 852 via communications system(s) 908, and so on. Memory 910 can include any suitable volatile memory, non-volatile memory, storage, or any suitable combination thereof. For example, memory 910 can include random-access memory ("RAM"), read-only memory ("ROM"), electrically programmable ROM ("EPROM"), electrically erasable ROM ("EEPROM"), other forms of volatile memory, other forms of non-volatile memory, one or more forms of semi-volatile memory, one or more flash drives, one or more hard disks, one or more solid state drives, one or more optical drives, and so on. In some embodiments, memory 910 can have encoded thereon, or otherwise stored therein, a computer program for controlling operation of computing device 850. In such embodiments, processor 902 can execute at least a portion of the computer program to present content (e.g., images, user interfaces, graphics, tables), receive content from server 852, transmit information to server 852, and so on. For example, the processor 902 and the memory 910 can be configured to perform the methods described herein.

In some embodiments, server 852 can include a processor 912, a display 914, one or more inputs 916, one or more communications systems 918, and/or memory 920. In some embodiments, processor 912 can be any suitable hardware processor or combination of processors, such as a CPU, a GPU, and so on. In some embodiments, display 914 can include any suitable display devices, such as an LCD screen, LED display, OLED display, electrophoretic display, a computer monitor, a touchscreen, a television, and so on. In some embodiments, inputs 916 can include any suitable input devices and/or sensors that can be used to receive user input, such as a keyboard, a mouse, a touchscreen, a microphone, and so on.

In some embodiments, communications systems 918 can include any suitable hardware, firmware, and/or software for communicating information over communication network 854 and/or any other suitable communication networks. For example, communications systems 918 can include one or more transceivers, one or more communication chips and/or chip sets, and so on. In a more particular example, communications systems 918 can include hardware, firmware, and/or software that can be used to establish a Wi-Fi connection, a Bluetooth connection, a cellular connection, an Ethernet connection, and so on.

In some embodiments, memory 920 can include any suitable storage device or devices that can be used to store instructions, values, data, or the like, that can be used, for example, by processor 912 to present content using display 914, to communicate with one or more computing devices 850, and so on, Memory 920 can include any suitable volatile memory, non-volatile memory, storage, or any suitable combination thereof. For example, memory 920 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 920 can have encoded thereon a server program for controlling operation of server 852, In such embodiments, processor 912 can execute at least a portion of the server program to transmit information and/or content (e.g., data, images, a user interface) to one or more computing devices 850, receive information and/or content from one or more computing devices 850, receive instructions from one or more devices (e.g., a personal computer, a laptop computer, a tablet computer, a smartphone), and so on.

In some embodiments, the server 852 is configured to perform the methods described in the present disclosure. For example, the processor 912 and memory 920 can be configured to perform the methods described herein.

In some embodiments, data source 802 can include a processor 922, one or more data acquisition systems 924, one or more communications systems 926, and/or memory 928. In some embodiments, processor 922 can be any suitable hardware processor or combination of processors, such as a CPU, a GPU, and so on. In some embodiments, the one or more data acquisition systems 924 are generally configured to acquire data, images, or both, and can include an MRI system, Additionally or alternatively, in some embodiments, the one or more data acquisition systems 924 can include any suitable hardware, firmware, and/or software for coupling to and/or controlling operations of an MRI system. In some embodiments, one or more portions of the data acquisition system(s) 924 can be removable and/or replaceable.

Note that, although not shown, data source 802 can include any suitable inputs and/or outputs. For example, data source 802 can include input devices and/or sensors that can be used to receive user input, such as a keyboard, a mouse, a touchscreen, a microphone, a trackpad, a trackball, and so on. As another example, data source 802 can include any suitable display devices, such as an LCD screen, an LED display, an OLED display, an electrophoretic display, a computer monitor, a touchscreen, a television, etc., one or more speakers, and so on.

In some embodiments, communications systems 926 can include any suitable hardware, firmware, and/or software for communicating information to computing device 850 (and, in some embodiments, over communication network 854 and/or any other suitable communication networks). For example, communications systems 926 can include one or more transceivers, one or more communication chips and/or chip sets, and so on. In a more particular example, communications systems 926 can include hardware, firmware, and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 928 can include any suitable storage device or devices that can be used to store instructions, values, data, or the like, that can be used, for example, by processor 922 to control the one or more data acquisition systems 924, and/or receive data from the one or more data acquisition systems 924: to generate images from data; present content (e.g., data, images, a user interface) using a display: communicate with one or more computing devices 850; and so on. Memory 928 can include any suitable volatile memory, non-volatile memory, storage, or any suitable combination thereof. For example, memory 928 can include RAM, ROM, EPROM, EEPROM, other types of volatile memory, other types of non-volatile memory, one or more types of semi-volatile memory, one or more flash drives, one or more hard disks, one or more solid state drives, one or more optical drives, and so on. In some embodiments, memory 928 can have encoded thereon, or otherwise stored therein, a program for controlling operation of medical image data source 802. In such embodiments, processor 922 can execute at least a portion of the program to generate images, transmit information and/or content (e.g., data, images, a user interface) to one or more computing devices 850, receive information and/or content from one or more computing devices 850, receive instructions from one or more devices (e.g., a personal computer, a laptop computer, a tablet computer, a smartphone, etc.), and so on.

In some embodiments, any suitable computer-readable media can be used for storing instructions for performing the functions and/or processes described herein. For example, in some embodiments, computer-readable media can be transitory or non-transitory. For example, non-transitory computer-readable media can include media such as magnetic media (e.g., hard disks, floppy disks), optical media (e.g., compact discs, digital video discs, Blu-ray discs), semiconductor media (e.g., RAM, flash memory, EPROM, EEPROM), any suitable media that is not fleeting or devoid of any semblance of permanence during transmission, and/or any suitable tangible media. As another example, transitory computer-readable media can include signals on networks, in wires, conductors, optical fibers, circuits, or any suitable media that is fleeting and devoid of any semblance of permanence during transmission, and/or any suitable intangible media.

As used herein in the context of computer implementation, unless otherwise specified or limited, the terms "component," "system," "module," "framework," and the like are intended to encompass part or all of computer-related systems that include hardware, software, a combination of hardware and software, or software in execution. For example, a component may be, but is not limited to being, a processor device, a process being executed (or executable) by a processor device, an object, an executable, a thread of execution, a computer program, or a computer. By way of illustration, both an application running on a computer and the computer can be a component. One or more components (or system, module, and so on) may reside within a process or thread of execution, may be localized on one computer, may be distributed between two or more computers or other processor devices, or may be included within another component (or system, module, and so on).

In some implementations, devices or systems disclosed herein can be utilized or installed using methods embodying aspects of the disclosure. Correspondingly, description herein of particular features, capabilities, or intended purposes of a device or system is generally intended to inherently include disclosure of a method of using such features for the intended purposes, a method of implementing such capabilities, and a method of installing disclosed (or otherwise known) components to support these purposes or capabilities. Similarly, unless otherwise indicated or limited, discussion herein of any method of manufacturing or using a particular device or system, including installing the device or system, is intended to inherently include disclosure, as embodiments of the disclosure, of the utilized features and implemented capabilities of such device or system.

The present disclosure has described one or more preferred embodiments, and it should be appreciated that many equivalents, alternatives, variations, and modifications, aside from those expressly stated, are possible and within the scope of the invention.

The invention claimed is:

1. A method for magnetic resonance imaging, the method comprising:

(a) acquiring magnetic resonance data from a subject using a magnetic resonance imaging (MRI) system by:

generating a pulse sequence with the MRI system, the pulse sequence comprising:

a radio frequency (RF) excitation pulse;

a first frequency-modulated RF pulse having a first time-bandwidth product, wherein the first frequency-modulated RF pulse is generated after the RF excitation pulse;

a second frequency-modulated RF pulse having a second time-bandwidth product, wherein the second frequency-modulated RF pulse is generated after the first frequency-modulated RF pulse;

acquiring magnetic resonance data with the MRI system by sampling magnetic resonance signals formed in response to the RF excitation pulse, wherein a phase whose value is dependent on the first time-bandwidth product and the second time-bandwidth product is imparted to magnetic resonance signals formed in response to the RF excitation pulse, and a difference between the first time-bandwidth product and the second time-bandwidth product is changed at least one of within the pulse sequence or in repetitions of the pulse sequence in order to phase encode the magnetic resonance data;

(b) reconstructing an image from the acquired magnetic resonance data.

2. The method of claim 1, wherein the first frequency-modulated RF pulse and the second frequency-modulated RF pulse are adiabatic full-passage RF pulses.

3. The method of claim 1, wherein the first frequency-modulated RF pulse and the second frequency-modulated RF pulse are hyperbolic secant (HS) RF pulses.

4. The method of claim 1, wherein the difference between the first time-bandwidth product and the second time-bandwidth product is changed by changing a pulse duration of at least one of the first frequency-modulated RF pulse or the second frequency-modulated RF pulse in the repetitions of the pulse sequence.

5. The method of claim 4, wherein changing the pulse duration of at least one of the first frequency-modulated RF pulse or the second frequency-modulated RF pulse in the repetitions of the pulse sequence comprises increasing the pulse duration.

6. The method of claim 4, wherein a bandwidth of the first frequency-modulated RF pulse and the second frequency-modulated RF pulse is held constant while changing the pulse duration of at least one of the first frequency-modulated RF pulse or the second frequency-modulated RF pulse in the repetitions of the pulse sequence.

7. The method of claim 1, wherein the first time-bandwidth product is different from the second time-bandwidth product.

8. The method of claim 1, wherein in at least one repetition of the pulse sequence the first time-bandwidth product is set to be equal to the second time-bandwidth product.

9. The method according to claim 1, wherein reconstructing the image from the acquired magnetic resonance data comprises using an iterative model-based image reconstruction that models spatial encoding based on a signal evolution simulation.

10. The method of claim 9, wherein the signal evolution simulation comprises a full Bloch simulation.

11. The method of claim 9, wherein the iterative model-based image reconstruction takes receiver coil sensitivity data as an additional input.

12. The method of claim 9, wherein the iterative model-based image reconstruction comprises iteratively solving a regularized linear inverse problem.

13. A method for magnetic resonance imaging, the method comprising:

(a) acquiring magnetic resonance data from a subject using a magnetic resonance imaging (MRI) system to generate a pulse sequence that phase encodes the magnetic resonance data by imparting a phase to magnetic resonance signals by applying frequency-modulated radio frequency (RF) pulses to the subject, wherein the frequency-modulated RF pulses have variable time-bandwidth products, thereby defining an R-difference value between the frequency-modulated RF pulses, which causes the phase to be imparted to the magnetic resonance signals; and (b) reconstructing an image from the acquired magnetic resonance data.

14. The method of claim 13, wherein the pulse sequence phase encodes the magnetic resonance data by changing the R-difference value while acquiring the magnetic resonance data, such that a different phase is imparted to the magnetic resonance signals with each different R-difference value.

15. The method of claim 14, wherein the R-difference value is changed by increasing a pulse duration of one of the frequency-modulated RF pulses while keeping a bandwidth of the frequency-modulated RF pulses constant.

16. The method of claim 15, wherein the R-difference value is increased by increasing the pulse duration of one of the frequency-modulated RF pulses while keeping the bandwidth of the frequency-modulated RF pulses constant.

17. The method of claim 13, wherein the pulse sequence is a multi-shot pulse sequence and the R-difference value is changed for each shot of the multi-shot pulse sequence.

18. The method of claim 13, wherein the frequency-modulated RF pulses comprise adiabatic full passage RF pulses.

19. The method of claim 18, wherein the adiabatic full passage RF pulses comprise hyperbolic secant RF pulses.

20. The method of claim 13, wherein the frequency-modulated RF pulses comprise chirp RF pulses.

21. The method of claim 13, wherein the R-difference value is set to zero in at least one repetition of the pulse sequence.

* * * * *